US007626818B2

(12) United States Patent
Yoshida et al.

(10) Patent No.: US 7,626,818 B2
(45) Date of Patent: Dec. 1, 2009

(54) INVERTER APPARATUS

(75) Inventors: Toshihiro Yoshida, Suzuka (JP); Yoshihisa Hatozaki, Kobe (JP)

(73) Assignee: Fuji Electric Systems Co., Ltd., Tokyo (JP)

( * ) Notice: Subject to any disclaimer, the term of this patent is extended or adjusted under 35 U.S.C. 154(b) by 0 days.

(21) Appl. No.: 11/798,819

(22) Filed: May 17, 2007

(65) Prior Publication Data

US 2007/0279865 A1 Dec. 6, 2007

(30) Foreign Application Priority Data

May 31, 2006 (JP) ............................. 2006-151475

(51) Int. Cl.
*H05K 5/00* (2006.01)
*H05K 7/00* (2006.01)
*H05K 7/16* (2006.01)
*H05K 7/20* (2006.01)

(52) U.S. Cl. .................. 361/695; 361/727; 361/679.48; 361/690; 361/726; 361/679.49; 361/756; 454/184

(58) Field of Classification Search ................. 361/695, 361/679.48, 679.49, 690, 726–727, 756; 454/184
See application file for complete search history.

(56) References Cited

U.S. PATENT DOCUMENTS

| 4,459,638 | A | * | 7/1984 | Brehm et al. ................ 361/697 |
| 4,520,425 | A | * | 5/1985 | Ito ............................. 361/697 |
| 4,744,005 | A | * | 5/1988 | Milani ........................ 361/687 |
| 4,751,872 | A | * | 6/1988 | Lawson, Jr. ................. 454/184 |
| 5,485,350 | A | * | 1/1996 | Hecht et al. ................. 361/692 |
| 5,562,410 | A | * | 10/1996 | Sachs et al. ............... 415/213.1 |
| 6,061,237 | A | * | 5/2000 | Sands et al. ................. 361/695 |
| 6,135,875 | A | * | 10/2000 | French ....................... 454/184 |
| 6,186,889 | B1 | * | 2/2001 | Byrne ........................ 454/184 |
| 6,252,770 | B1 | * | 6/2001 | Yu et al. ..................... 361/695 |
| 6,322,042 | B1 | * | 11/2001 | Nemec ........................ 248/694 |
| 6,373,698 | B1 | * | 4/2002 | Christensen ................ 361/695 |
| 6,374,628 | B2 | * | 4/2002 | Willkommen ................ 62/288 |
| 6,400,568 | B1 | * | 6/2002 | Kim et al. .................... 361/697 |
| 6,594,148 | B1 | * | 7/2003 | Nguyen et al. .............. 361/695 |
| 6,657,320 | B1 | * | 12/2003 | Andrews et al. .............. 307/64 |
| 6,722,971 | B2 | * | 4/2004 | Gough ........................ 454/187 |
| 6,921,328 | B1 | * | 7/2005 | Nohara et al. ............... 454/184 |
| 6,961,248 | B2 | * | 11/2005 | Vincent et al. .............. 361/796 |
| 6,967,833 | B2 | * | 11/2005 | Boykin et al. ............... 361/685 |

(Continued)

FOREIGN PATENT DOCUMENTS

CN        U 2438166 Y        7/2001

(Continued)

*Primary Examiner*—Jayprakash N Gandhi
*Assistant Examiner*—Bradley H Thomas
(74) *Attorney, Agent, or Firm*—Manabu Kanesaka

(57) ABSTRACT

An inverter apparatus includes heating components housed in an inverter main body and cooling fans for cooling the heating components. The inverter apparatus includes a fan unit case in which the cooling fans are housed as one integral unit, a housing space formed on an outer side of a ceiling surface of the inverter main body, and a fan cover that fixes the fan unit case. The fan unit case is slid to be housed in the housing space. The inverter apparatus makes it easier to replace cooling fans, reduce the number of components, enhance cooling efficiency, and secure high reliability.

5 Claims, 11 Drawing Sheets

U.S. PATENT DOCUMENTS

| | | | |
|---|---|---|---|
| 7,021,895 B2* | 4/2006 | Rubenstein et al. | 415/207 |
| 7,209,350 B2* | 4/2007 | Merlet et al. | 361/694 |
| 7,245,485 B1* | 7/2007 | Morrell | 361/687 |
| 7,418,995 B2* | 9/2008 | Howard et al. | 165/80.3 |
| 2001/0008480 A1* | 7/2001 | Huang | 361/687 |
| 2004/0130868 A1* | 7/2004 | Schwartz et al. | 361/687 |
| 2005/0286221 A1* | 12/2005 | Yamana et al. | 361/687 |
| 2006/0171115 A1* | 8/2006 | Cramer | 361/695 |
| 2006/0256522 A1* | 11/2006 | Wei et al. | 361/695 |
| 2007/0053154 A1* | 3/2007 | Fukuda et al. | 361/687 |

FOREIGN PATENT DOCUMENTS

| | | |
|---|---|---|
| CN | U 2458657 Y | 11/2001 |
| EP | 0 103 412 | 3/1984 |
| JP | 2005-064046 | 3/2005 |

* cited by examiner

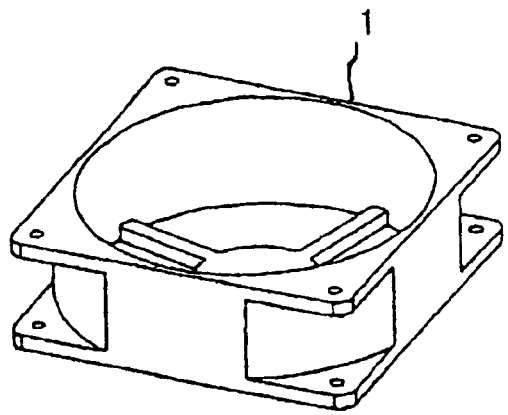
Fig. 2
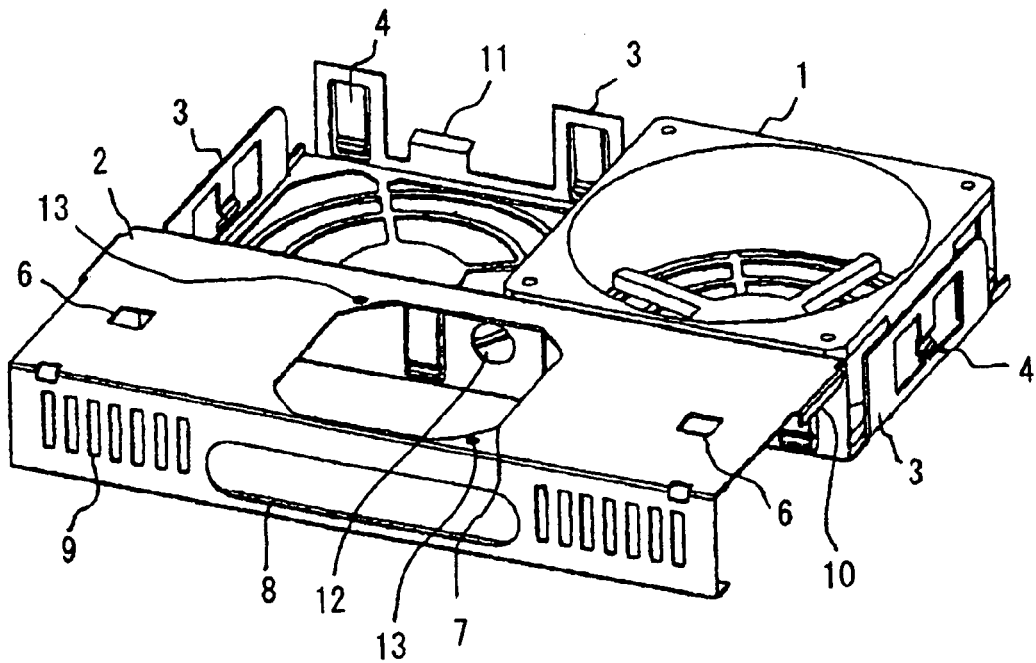
Fig. 3
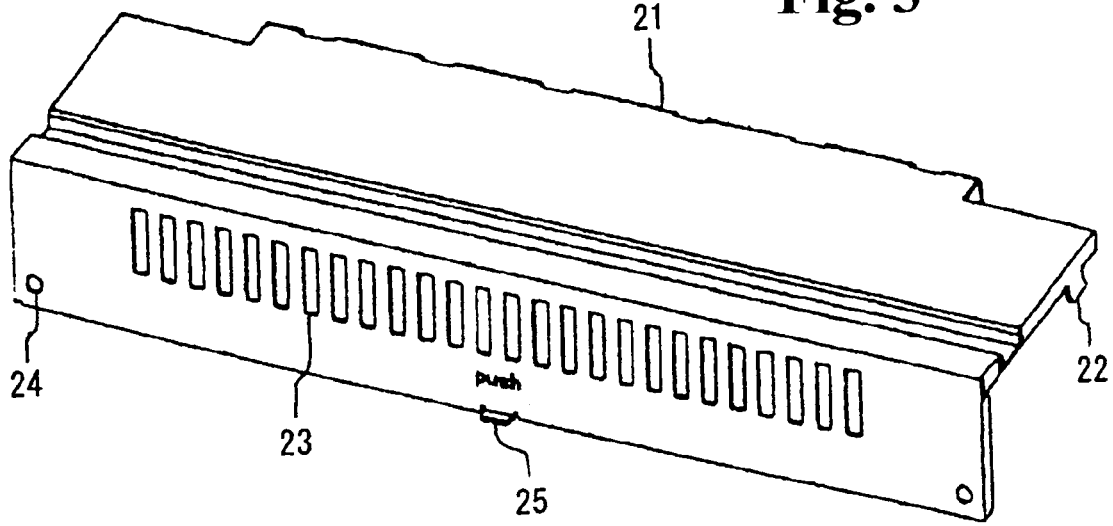

INVERTER APPARATUS

BACKGROUND OF THE INVENTION AND RELATED ART STATEMENT

The present invention relates to an inverter apparatus including heating components and cooling fans, and more particularly to an inverter apparatus wherein cooling fans are replaceable.

Inverter apparatuses which are power converters are equipped with a printed-circuit board on which a control circuit and a power supply circuit are mounted, a main circuit including semiconductor elements, a cooling fin for the semiconductor elements, etc. as well as cooling fans for cooling these components. The cooling fans are required to be replaceable, and various mounting structures therefor have been proposed (see Japanese Laid-Open Patent Publication (Kokai) No. 2005-64046, for example).

FIG. 8 is an exploded perspective view showing how cooling fans are mounted in such a conventional inverter apparatus. FIG. 8 illustrates the construction of a fan unit case that houses the cooling fans. In this fan unit case, a plurality of cooling fans 101 are fixed to a sheet-metal mounting plate 102 by screws 103. The mounting plate 102 is provided with screws, not shown, so as to fix wires for supplying power to the cooling fans 101.

FIG. 9 is an exploded perspective view showing how cooling fans are mounted in another conventional inverter apparatus. As is the case with FIG. 8, FIG. 9 illustrates the construction of a fan unit case. In this fan unit case, a plurality of cooling fans 101 is fixed to a plastic mounting plate 104 by screws 103. The mounting plate 104 is provided with screws 105, not shown, so as to fix wires for supplying power to the cooling fans 101.

FIG. 10 is an external perspective view showing the conventional inverter apparatus as mentioned above. This inverter apparatus is configured as an integral-type inverter unit. A front cover 111 is fixed to the inverter main by screws 112, and a fan unit case that houses cooling fans is disposed inside the inverter unit.

FIGS. 11 and 12 are perspective views showing how to replace the cooling fans of the conventional inverter apparatus. In replacing the cooling fans, the screws 12 are unscrewed to open the front cover 111 (see FIG. 10), so that the fan unit case inside the inverter unit is exposed. Next, the screws that fix the wires for supplying power to the cooling fans 101 and the screws 113 that fix the fan unit case are unscrewed. The fan unit case 115 is then pulled forward (i.e. in a direction indicated by the arrow in FIG. 12) to replace the cooling fans 101.

New cooling fans 101 are housed following the above described removal steps in reverse. Specifically, the fan unit case 115 housing the cooling fans 101 is put back into the inverter unit, then the wires are fixed by the screws, and the fan unit case 115 is fixed by the screws 113. The front cover 111 is then fixed to the inverter main body by the screws 112. It should be noted that the above-mentioned components are screwed and unscrewed using predetermined tools such as drivers.

The conventional converter apparatuses constructed as described above, however, are expensive since a large number of components are required to satisfy a plurality of required functions, such as maintaining strength, fixing the cooling fans, and preventing bypass of cooling air.

Accordingly, a large amount of time is required since a large number of locations have to be screwed. For replacing cooling fans, screws have to be unscrewed using tools so as to open the front cover, and also, the fan unit case itself have to be pulled out since the fan unit case is fixed to the inside of the inverter unit by the screws.

For this reason, the conventional converter apparatuses have the problem that the replacement of cooling fans is complicated and time-consuming, and it requires a large amount of time and also have the problem that screws are mistakenly dropped. Also, when the fan unit case is pulled out, dust accumulated on the cooling fans for many years of usage falls into the inverter unit, which necessitates cleaning, and in some cases, causes an insulation failure or ignition. Further, since the cooling fans themselves are disposed away from holes in a lattice pattern formed in the uppermost surface (i.e. ceiling surface) of the inverter unit, the efficiency of the cooling fans is decreased due to a significant pressure drop of exhaust air.

It is an object of the present invention to provide an inverter apparatus that can make it easier to replace cooling fans, reduce the number of components, enhance cooling efficiency, and secure high reliability.

Further objectives and advantages of the invention will be apparent from the following description of the invention.

SUMMARY OF THE INVENTION

To achieve the above object, an inverter apparatus including heating components housed in an inverter main body and cooling fans for cooling the heating components comprises: a fan unit case in which the cooing fans are housed as one integral unit; a housing space formed on an outer side of a ceiling surface of an inverter main, a fan unit case being slid to be housed in the housing space; and a fan cover that fixes the fan unit case.

With this arrangement, since the housing space for the fan unit case is formed on the outer side of the ceiling surface of the inverter main body, and the fan unit case is attached to and removed from the fan unit case by sliding in the longitudinal direction of the inverter apparatus, a front cover does not have to be removed from the inverter unit in replacing the cooling fans, and there is no need for forming a cooling fan replacement space on the ceiling surface of the inverter unit. Thus, easy replacement of the cooling fans can be achieved, the number of components can be reduced, cooling efficiency can be enhanced, and high reliability can be secured.

BRIEF DESCRIPTION OF THE DRAWINGS

FIG. 2 is a perspective view showing the construction of the fan unit case in FIG. 1 turned upside down;

FIG. 3 is a perspective view showing the shape of a fan cover according to the embodiment;

DETAILED DESCRIPTION OF PREFERRED EMBODIMENTS

Preferred embodiments of the present invention will now be described with references to the drawings.

Figure 1:
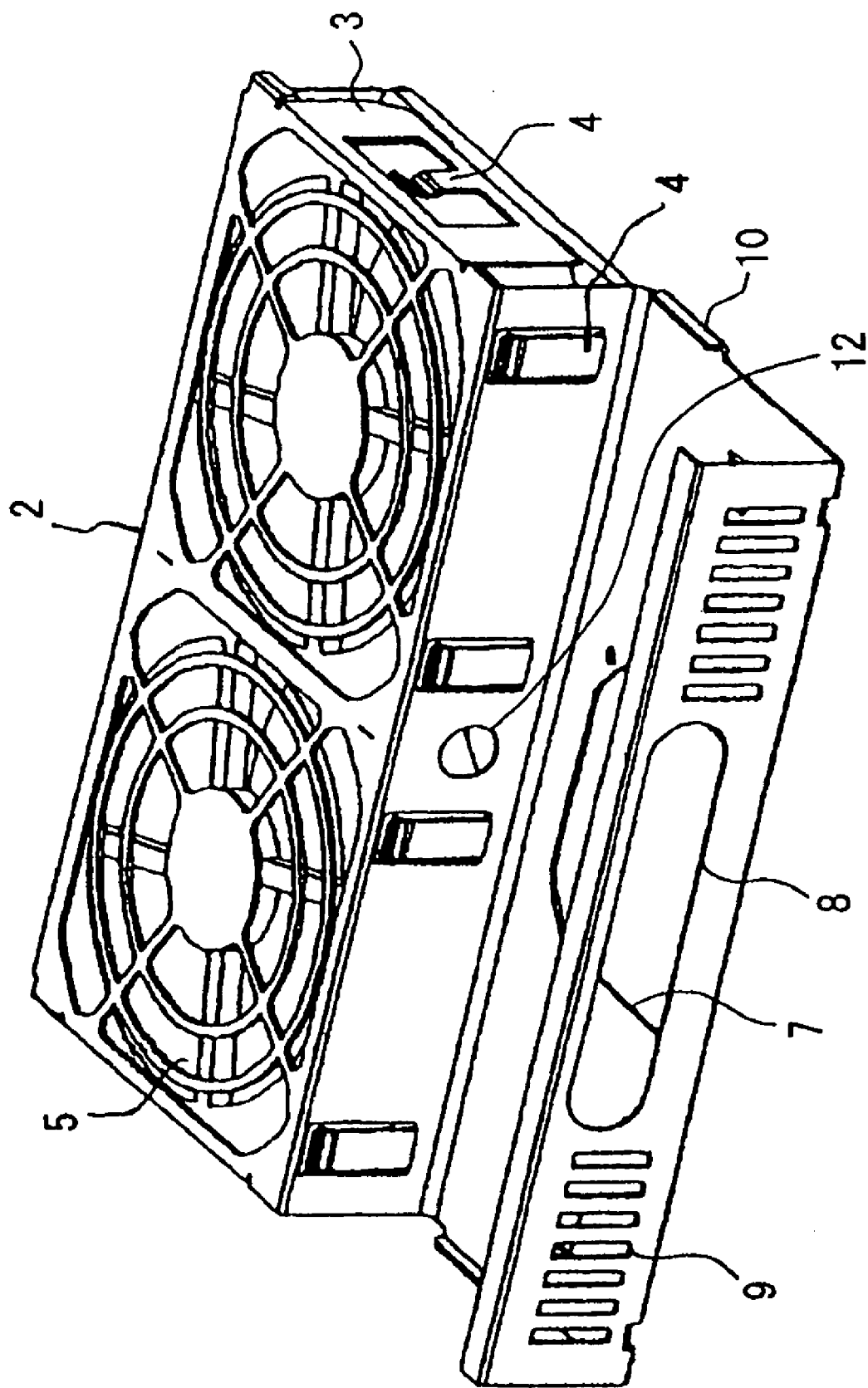
FIG. 1 is a perspective view showing how cooling fans are mounted in an inverter apparatus according to an embodiment of the present invention.
Figure 4:
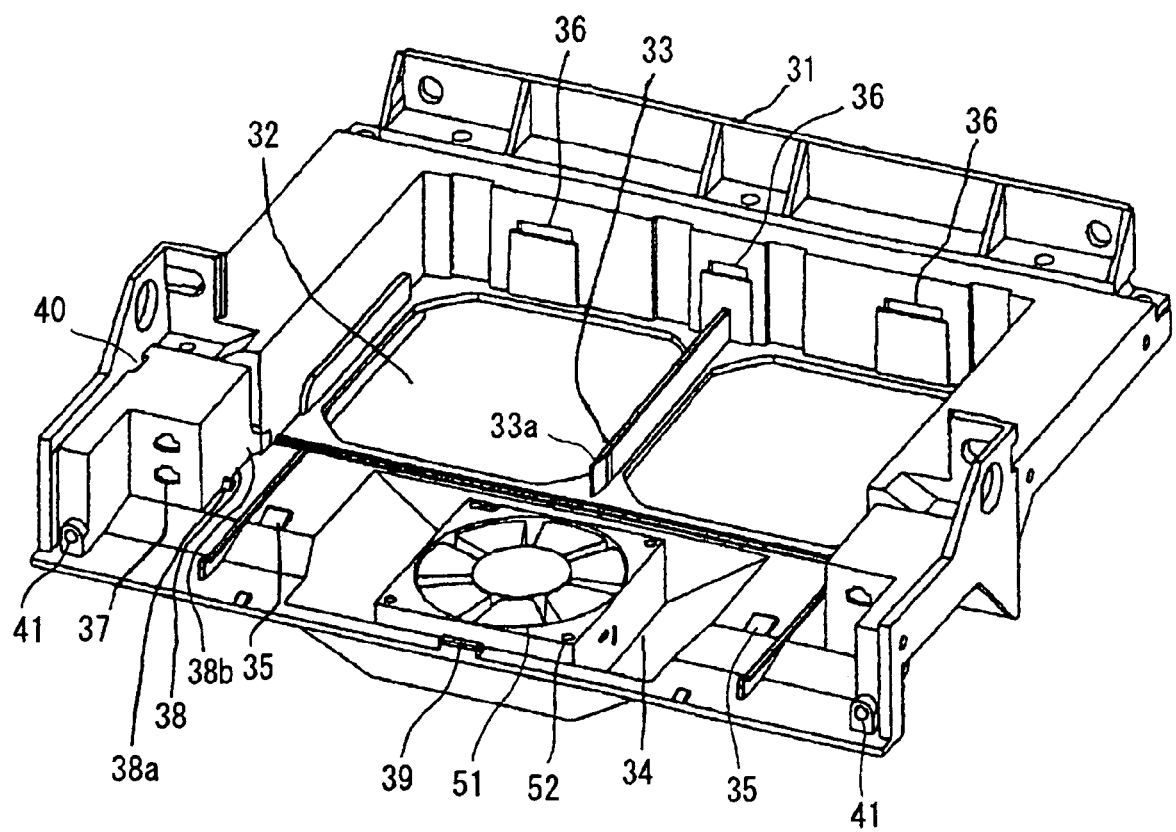
FIG. 4 is a perspective view showing the shape of a die-cast case according to the embodiment.

FIGS. 1 and 2 are perspective views showing how cooling fans are mounted in an inverter apparatus according to an embodiment of the present invention, in which FIG. 2 shows the inverter apparatus of FIG. 1 turned upside down. In the fan unit case in FIGS. 1 and 2, a plurality of cooling fans for cooling heating components provided in an inverter main body is housed as one integral unit. FIG. 3 is a perspective view showing a fan cover according to the embodiment which fixes the fan unit case, and FIG. 4 is a perspective view showing a die-cast case according to the embodiment in which the fan unit case is housed.

Figure 5:
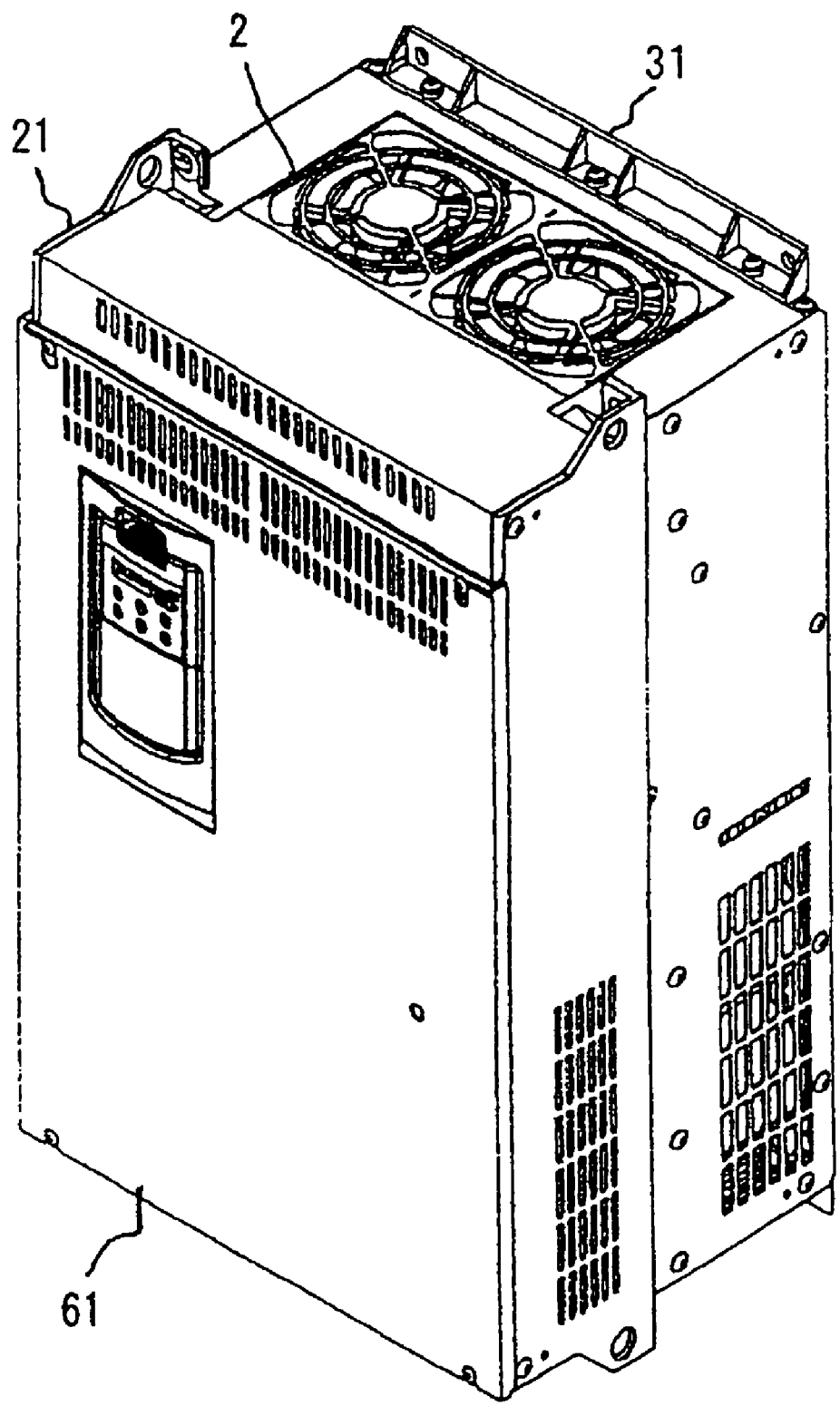
FIG. 5 is an external perspective view showing the inverter apparatus according to the embodiment.
Figure 6:
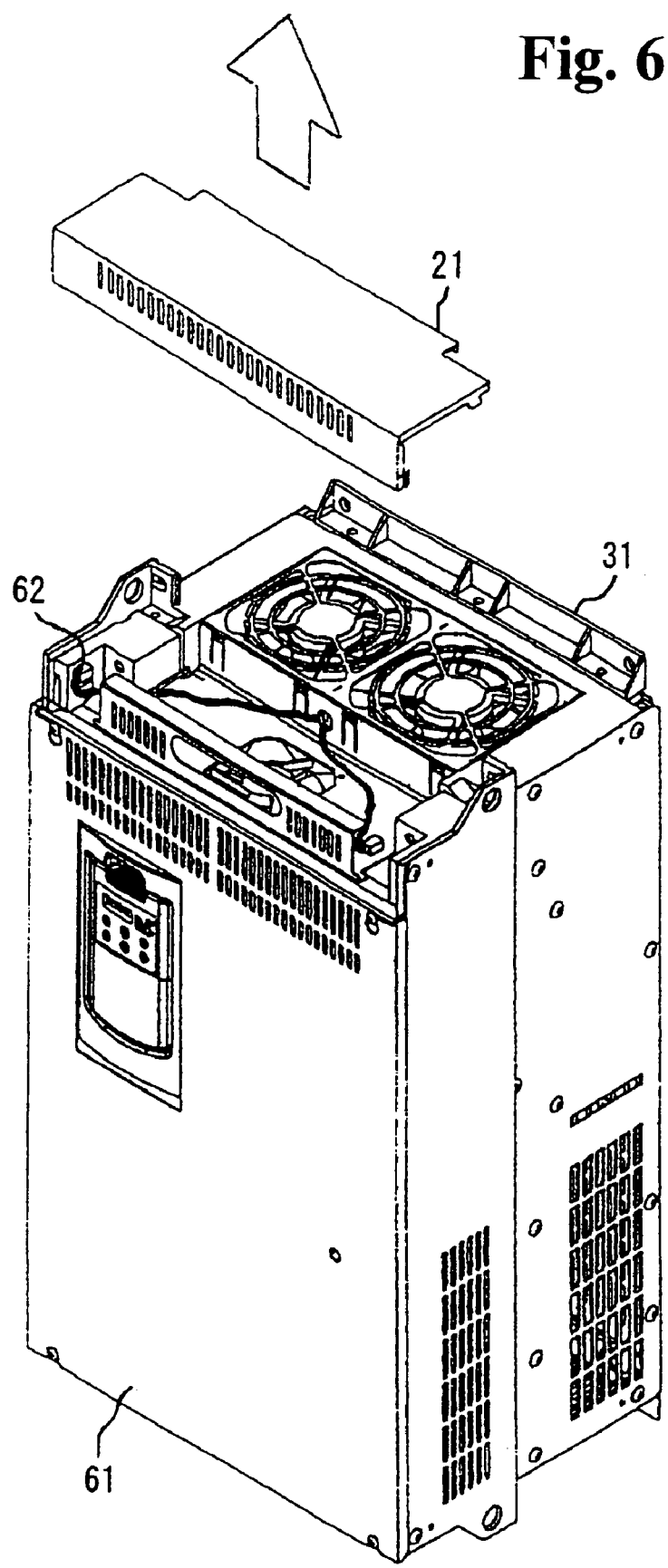
FIG. 6 is a perspective view showing how to replace the cooling fans of the inverter apparatus according to the embodiment.
Figure 7:
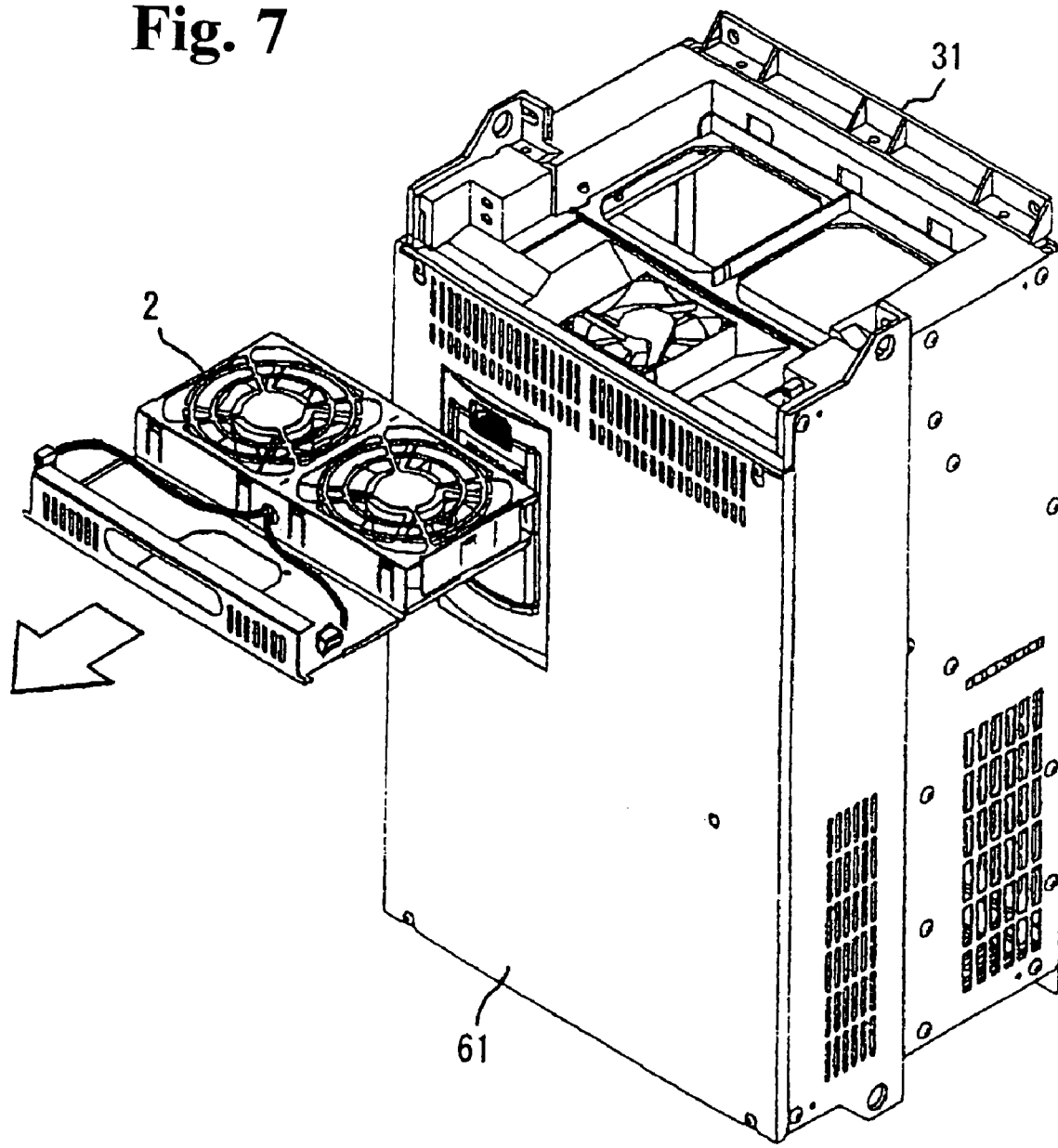
FIG. 7 is a perspective view showing how to replace the cooling fans of the inverter apparatus according to the embodiment.
Figure 8:
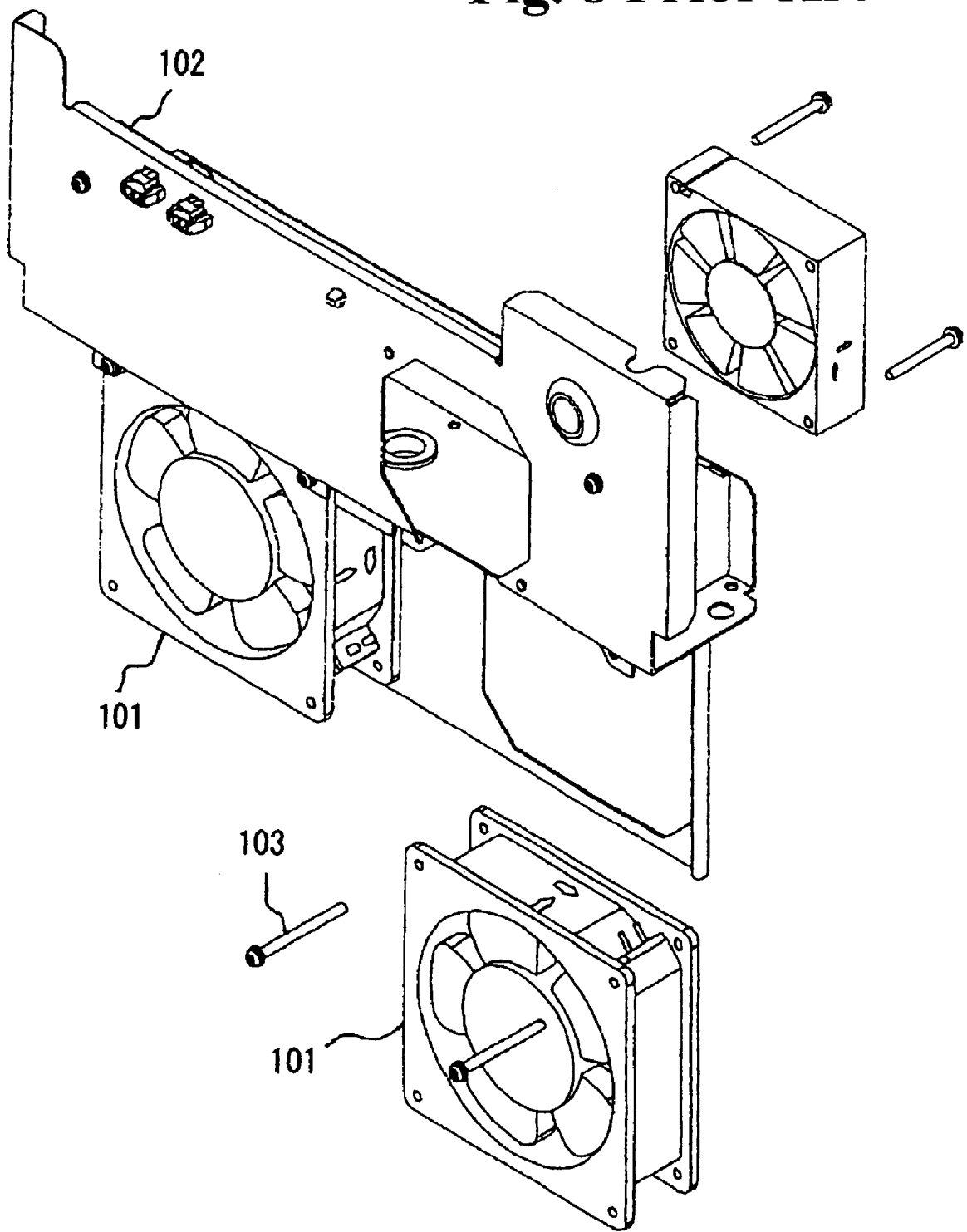
FIG. 8 is an exploded perspective view showing the construction of a conventional inverter apparatus with cooling fans mounted thereon.
Figure 9:
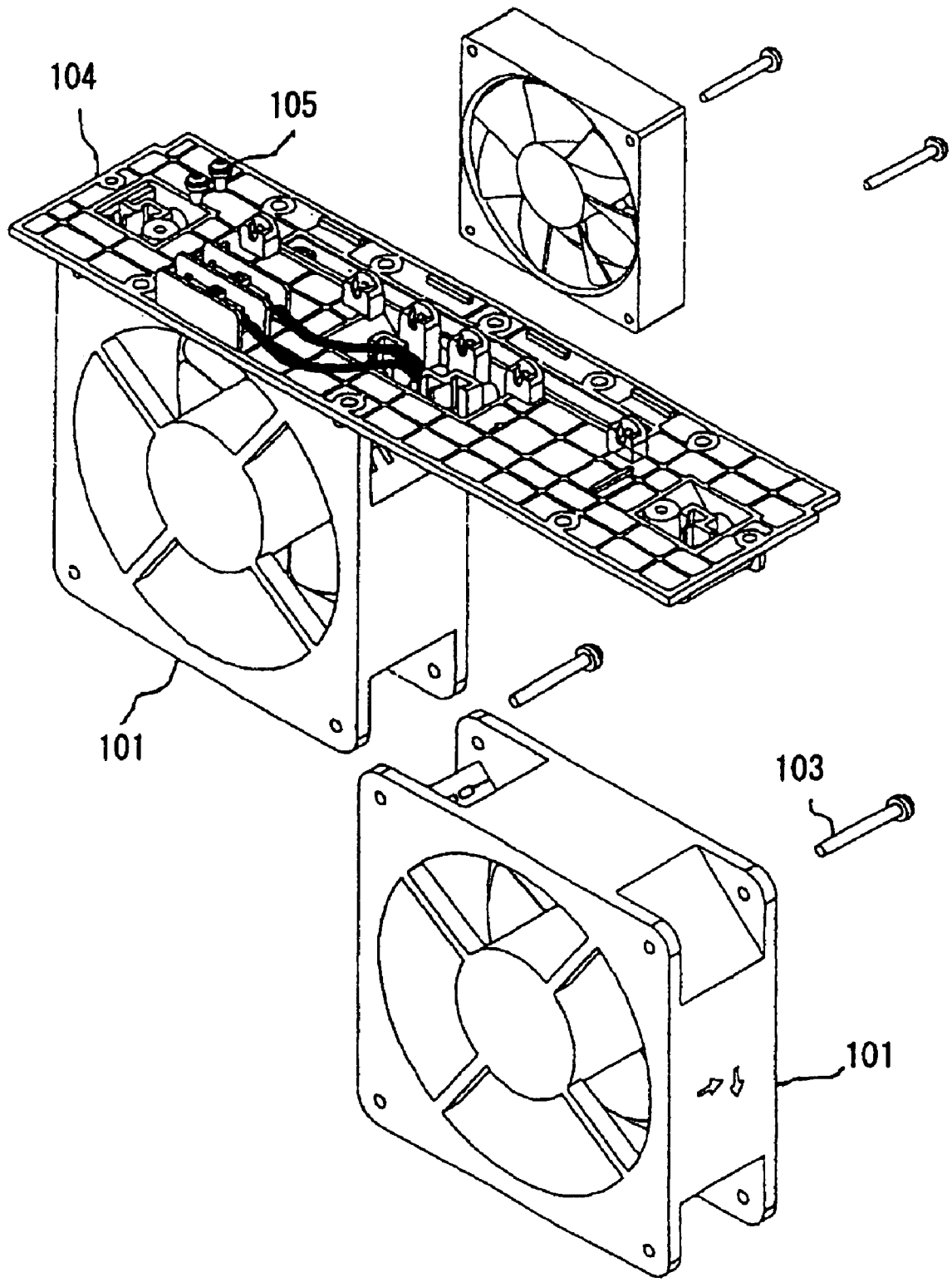
FIG. 9 is an exploded perspective view showing how cooling fans are mounted in a conventional inverter apparatus.
Figure 10:
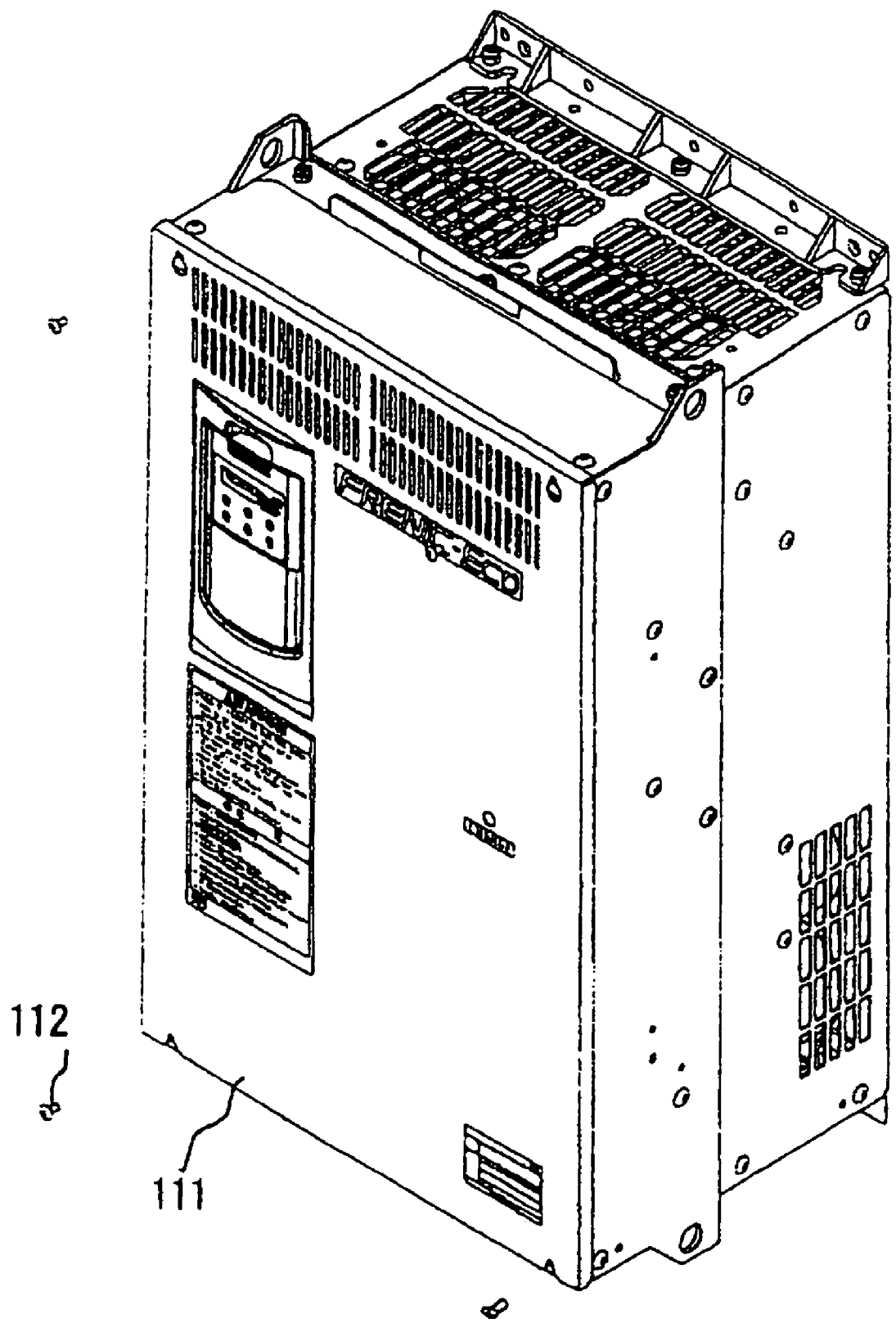
FIG. 10 is an exploded perspective view showing how cooling fans are mounted in another conventional inverter apparatus.
Figure 11:
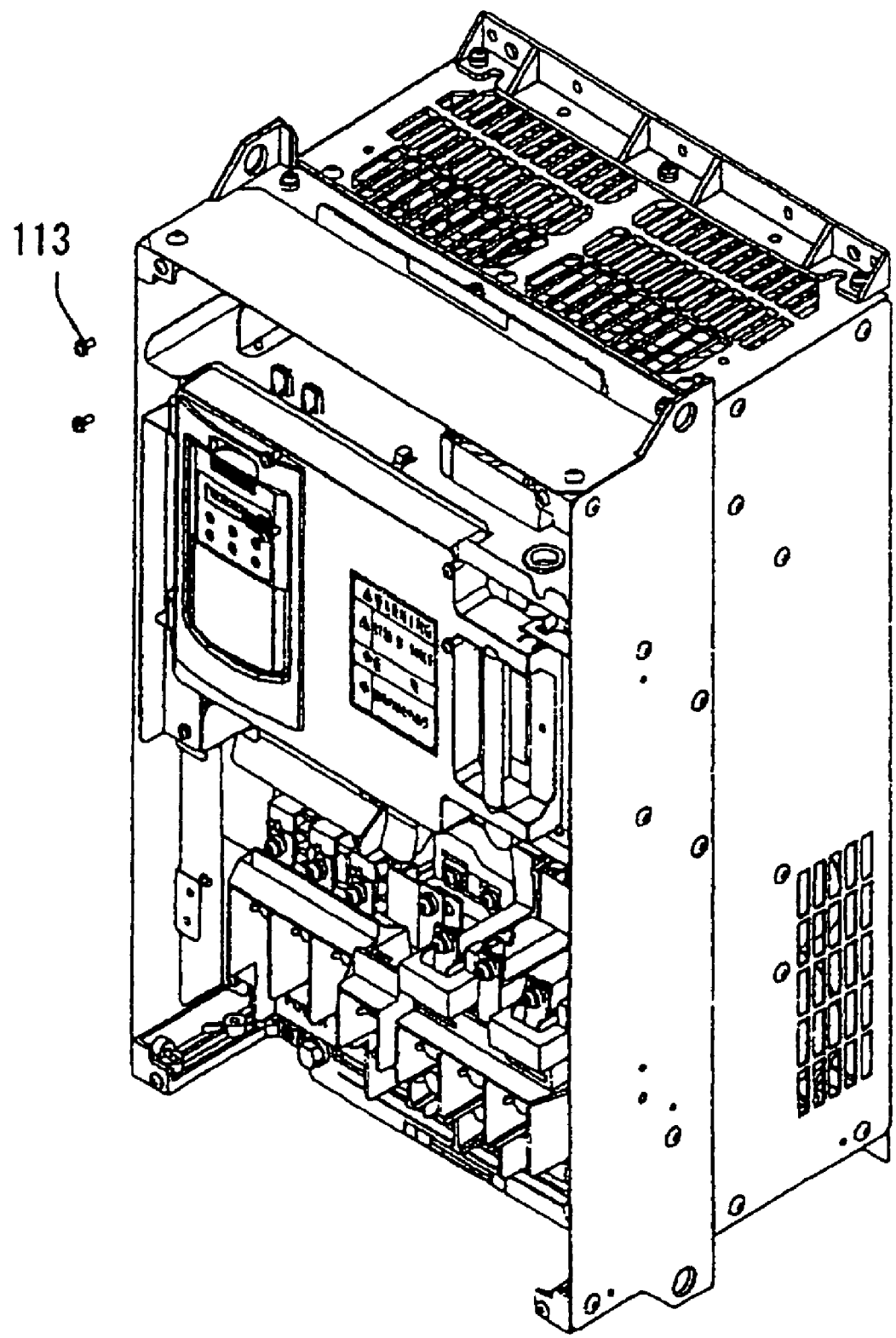
FIG. 11 is a perspective view showing how to replace the cooling fans of the conventional inverter apparatus.
Figure 12:
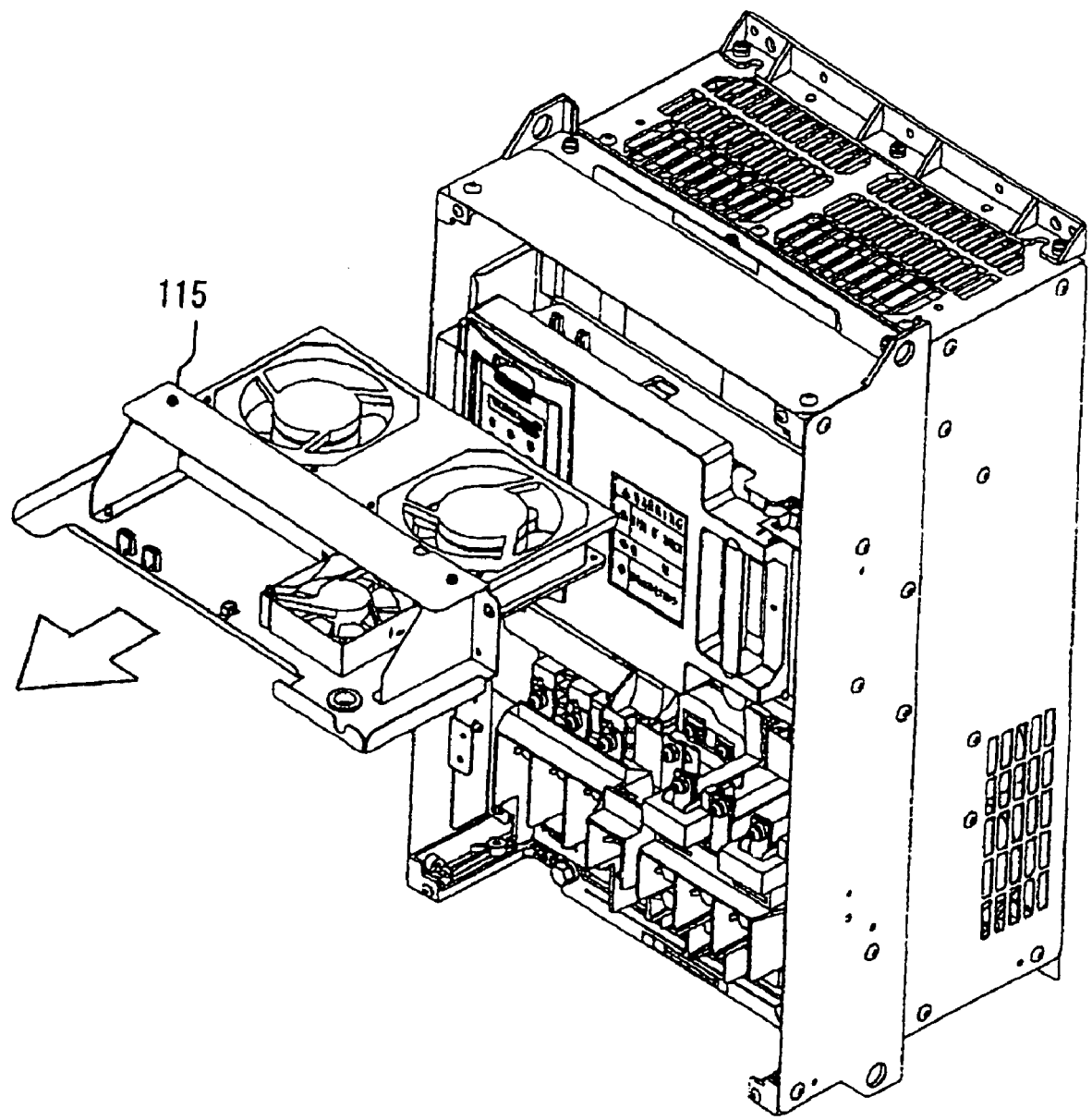
FIG. 12 is a perspective view showing how to replace the cooling fans of the conventional inverter apparatus.

The fan unit case 2 in which the plurality of cooling fans 1 is housed as one integral unit is housed in a housing space formed on an outer side of a ceiling surface of the inverter main body as shown in FIGS. 5 to 7, referred to later. The fan unit case 2 is attached to and removed from the housing space by sliding from the housing space in the longitudinal direction of the inverter apparatus. The fan unit case 2 has a base with an S-shaped cross-section and has a plurality of side walls 3 standing upright in three directions from the surface on which the cooling fans 1 are fixed, and claws 4 for fixing the cooling fans 1. Each claw 4, which functions as a spring, is formed by making a U-shaped cut in an arbitrary side wall 3 and squeezing the middle section thereof in V shape.

Further, on the surface of the fan unit case 2 to which the cooling fans 1 are fixed, holes 5 that suit the shapes of the cooling fans 1 are formed. On the other surface of the fan unit case 2, two rectangular holes 6 are formed at the right and left sides, and a hexagonal hole 7 is formed in the middle section. On a side wall raised up at a right angle from this surface, an oval hole 8 for use in pulling out the fan unit case 2 is formed in the middle section, and a plurality of rectangular holes (slits) 9 is formed at both sides.

The rectangular holes 6 formed at the right and left sides are holes into which projections 35 of a die-cast case 31 are fitted, and are used for fixing the fan unit case 2 in the longitudinal direction thereof. The hexagonal hole 7, which is formed to suit the shape of an internal fan 51 appearing in FIG. 4, is a hole through which air passes. The oval hole 8 is a hole through which exhaust air from the internal fan 51 passes and also serves as a rest for fingers in pulling out the fan unit case 2. Also, the rectangular holes 9 are holes through which exhaust air from the internal fan 51 passes.

The fan unit case 2 also includes two claws or hooks 10, which are formed at the right and left sides and fit into claw holding portions 38 of the die-cast case 31, and a plurality of (in the present embodiment, three) claws or hooks 11, which fits into rectangular holes 36 of the die-cast case 31. The claws 10 fix the fan unit case 2 in the longitudinal direction thereof, and the claws 11 fix the fan unit case 2 in the vertical direction thereof. It should be noted that the fan unit case 2 is fixed in the transverse direction thereof by right and left side walls of the die-cast case 31. A round hole 12 is a hole through which an electric wire having power connectors 62 for supplying power to the cooling fans 1 is threaded, and screw holes 13 are for fixing the internal fan 51. Basically, no screws are used for the screw holes 13 since the fan unit case 2 is configured to be attachable and removable without the use of tools, but the screw holes 13 are provided as backups for a situation where there are strong vibrations and impacts.

The fan cover 21 has hook-shaped claws 22 formed at the right and left sides so as to be fixed to the die-cast case 31. The fan cover 21 is constructed such that both sides of a base with a U-shaped cross-section are bent inward. On the surface of the fan cover 21 which is bent toward the front, rectangular holes (slits) 23 and screw holes 24 are formed at the right and left sides of the rectangular holes 23, and an L-shaped fixing claw 25 is formed in a lower part of the middle section.

The hook-shaped claws 22 are used for fixing the fan unit case 2, and the die-cast case 31 is provided with holes (or claws) 40 with which the claws 22 are engaged. In the illustrated example, the claws 22 are fit into the holes 40. The rectangular holes 23 are holes though which exhaust air from the internal fan 51 passes, and the screw holes 24 are used for fixing the fan cover 21. Basically, no screws are used for the screw holes 24 since the fan cover 21 is configured to be attachable and removable without the use of tools, but the screw holes 24 are provided as backups for a situation where there are strong vibrations and impacts. The claw 25 is engaged with a claw 39 of the die-cast case 31.

The die-cast case 31, which constitutes the ceiling surface of the inverter main body mentioned above, forms the above-mentioned housing space and has a concave groove in the direction of the thickness (vertical direction). In the bottom surface of the concave groove, a plurality of (in the illustrated example, two) rectangular holes 32 that fit the shapes of the cooling fans 1 is formed, and a convex rib 33 is formed in the middle section. Further, on the front of the concave groove, a tapered concave portion 34 into which the internal fan 51 is fit is formed, and two triangular pyramid-shaped projections 35 are formed at both sides of the concave portion 34. The projections 35 fit into the rectangular holes 6 of the fan unit case 2 to fix the fan unit case 2 in the longitudinal direction thereof. Further, the plurality of rectangular holes 36 is formed on the surface raised up at a right angle from the rear of the bottom surface of the die-cast case 31, and one or two convex holes 37 are formed on the surfaces standing upright on the both right and left parts of the bottom surface on the front.

The convex rib 33 is interposed between the two cooling fans 1 and has a tapered surface 33a. In mounting the fan unit case 2 on the die-cast case 31, the cooling fans 1 spread to the right and left, respectively, as the fan unit case 2 is slid, so that the cooling fans 1 can be fixed. The rectangular holes 36 are holes into which the claws 11 of the fan unit case 2 are fit and fix the fan unit case 2 in the vertical direction thereof. The convex holes 37 are holes into which the power connectors 62 for the cooling fans 1, described later, are threaded.

The claw holding portions 38, into which the claws 10 of the fan unit case 2 are fit, are each interposed between a projection 38a and a side wall 38b and fix the fan unit case 2 in the longitudinal direction thereof. The claw 39 is engaged with the claw 25 of the fan cover 21. The holes 40 are holes into which the claws 22 of the fan cover 21 are fit. Screw holes 41 are provided as backups for fixing the fan cover 21 in conjunction with the screw holes 24 of the fan cover 21. The internal fan 51 is used for cooling the interior of the inverter apparatus. On the other hand, the cooling fans 1 are used for cooling a cooling fin with the above-mentioned heating components mounted thereon. Screw holes 52 are provided as backups for fixing the internal fan 51 in conjunction with the screw holes 13 of the fan unit case 2.

It should be note that the rectangular holes 6, claws 10, and claws 11 of the fan unit case 2, the claws 22 and claw 25 of the fan cover 21, and the projections 35, rectangular holes 36, claw holding portions 38, claw 39, and holes 40 of the die-cast case 31 are engaging members or engaged members of the present invention, which fix the fan unit case 2, fan cover 21, and die-cast case 31.

FIG. 5 is an external perspective view showing the inverter apparatus according to the preset embodiment. The inverter apparatus is configured as an integral-type inverter unit, and a front cover 61 is fixed to the inverter main body. The fan unit case 2 housing the cooling fans 1 is housed in the die-cast case 31 disposed in the housing space provided in an upper part of the inverter unit, and the fan cover 21 is mounted on the die-cast case 31.

FIGS. 6 and 7 are perspective views showing how to replace the cooling fans in the inverter apparatus according to the present embodiment.

In replacing the cooling fans, the L-shaped claw 25, in FIG. 3, is disengaged from the die-cast case 31 using the deformation caused by a finger pressing the middle section of the fan cover 21 (i.e. an area around the claw 25), and the fan cover 21 is turned clockwise around the claws 22 as viewed from the right side of FIG. 6 and removed from the die-cast case 31 (see FIG. 6). Next, the power connectors 62 are pulled out from the front of the die-cast case 31, and then the hook of the fan unit case 2 is slightly pulled up toward the front to disengage the projections 35 of the die-cast case 31 in FIG. 4 from the rectangular holes 6 of the fan unit case 2 in FIG. 2 and disengage the claw holding portions 38 of the die-cast case 31 from the claws 10 of the fan unit case 2. The fan unit case 2 is then pulled toward the front (see FIG. 7).

In this way, the cooling fans 1 and the fan unit case 2 are pulled out in conjunction with each other, and the cooling fans 1 are replaced. After that, following the above removal steps in reverse, the fan unit case 2 housing new cooling fans 1 is slid toward the rear and housed in the die-cast case 31, and then the fan cover 21 is fixed to the die-cast case 31. This completes the replacement of the cooling fans 1.

In the present embodiment, since the housing space for the fan unit case 2 is formed on the outer side of the ceiling surface of the inverter main body, and the fan unit case 2 is attached to and removed from the fan unit case by being slid in the longitudinal direction of the inverter apparatus, it is unnecessary to remove the front cover 61 in replacing the cooling fans 1. Thus, easy replacement of the cooling fans can be achieved, the number of components can be reduced, pressure drop of exhaust air can be decreased, cooling efficiency can be enhanced, and high reliability can be secured.

Also, in the present embodiment, all the components are removable without using tools. Specifically, the cooling fans 1 can be fixed with a single motion, using the claws 4 of the fan unit case 2 which function as springs, that is, the cooling fans 1 can be fixed without using tools. Also, since the fan unit case 2 is slid to be housed in the die-cast case 31 and locked using the claws and the holes, and the claws of the fan cover 21 are engaged with the holes and claws of the die-cast case 31, there is no need for fixing screws and reinforcing metal sheets that have been conventionally required. The number of assembling steps, the time required for replacement, and costs also can be significantly reduced.

Further, in replacing the cooling fans 1, it is unnecessary to remove the front cover 61 from the inverter unit as mentioned above since the housing space for the fan unit case 2 is formed on the die-cast case 31. Also, since the fan unit case 2 itself can be fixed only by the engaging/locking mechanism of the fan cover 21, the fan unit case 2 can be removed from the inverter unit with a single motion without using tools such as drivers. Therefore, the time required for replacement can be significantly reduced.

Also, since the fan unit case 2 is disposed on the outer side of the inverter unit, dust accumulated on the cooling fans 1 does not fall into the inverter unit when the fan unit case 2 is pulled forward. Further, since the cooling fans 1 are disposed on top of the inverter unit, pressure drop of exhaust air can be reduced, cooling efficiency can be enhanced, and it also prevents screws from falling by mistake. As a result, the quality of the inverter unit can be significantly improved.

The disclosure of Japanese Patent Application No. 2006-151475 filed on May 31, 2006 is incorporated as a reference.

While the invention has been explained with reference to the specific embodiments of the invention, the explanation is illustrative and the invention is limited only by the appended claims.

What is claimed is:

1. An inverter apparatus comprising:
   a fan unit case including two cooling fans arranged side by side and housed in the fan unit case as one integral unit;
   an inverter main body having a housing space formed on an outer side of a ceiling surface of the inverter main body, said fan unit case being slid to be housed in said housing space; and
   a fan cover fixed to said fan unit case,
   wherein said inverter main body comprises a die-cast case constituting the ceiling surface of the inverter main body and forming the housing space, said die-cast case having a concave portion that houses said fan unit case and a rib formed in a middle of the concave portion, said die-cast case and said fan unit case being fixed in such a manner that engaging members provided in one of said die-cast case and said fan unit case and engaged members provided in the other of said die-cast case and said fan unit case are engaged with each other, and
   the rib is situated between the two cooling fans when the fan unit case is installed in the inverter main body and has a tapered surface so that as the fan unit case is slid into the die-cast case, the cooling fans are spread right and left by the tapered surface, respectively, to fix the cooling fans.

2. An inverter apparatus according to claim 1, wherein said fan unit case holds the cooling fans using members functioning as springs.

3. An inverter apparatus according to claim 1, wherein said engaging members are claws and said engaged members are holes engaging the claws.

4. An inverter apparatus according to claim 1, wherein said die-cast case includes a concave groove in a thickness direction of the case, and two holes for the cooling fans spaced apart from each other formed in a bottom of the concave groove so that when the fan unit is installed in the concave groove, said rib is located between the two holes and each of the cooling fans is located immediately above each of the two holes.

5. An inverter apparatus according to claim 4, wherein said die-cast case further includes a tapered concave portion adjacent to the two holes, an internal fan being installed in the tapered concave portion.

* * * * *

UNITED STATES PATENT AND TRADEMARK OFFICE
CERTIFICATE OF CORRECTION

| | | |
|---|---|---|
| PATENT NO. | : 7,626,818 B2 | Page 1 of 1 |
| APPLICATION NO. | : 11/798819 | |
| DATED | : December 1, 2009 | |
| INVENTOR(S) | : Toshihiro Yoshida et al. | |

It is certified that error appears in the above-identified patent and that said Letters Patent is hereby corrected as shown below:

Please change column 5, line 12, "to the preset embodiment." to --to the present embodiment.--, and column 6, line 57, "the fan unit" to --the fan unit case--.

Signed and Sealed this

Thirtieth Day of March, 2010

David J. Kappos
*Director of the United States Patent and Trademark Office*